United States Patent [19]

Koch

[11] Patent Number: 4,628,364

[45] Date of Patent: Dec. 9, 1986

[54] TWO-DIMENSIONAL SEMICONDUCTOR IMAGE SENSOR INCLUDING AN ARRANGEMENT FOR REDUCING BLOOMING

[75] Inventor: Rudolf Koch, Unterhaching, Fed. Rep. of Germany

[73] Assignee: Siemens Aktiengesellschaft, Berlin and Munich, Fed. Rep. of Germany

[21] Appl. No.: 518,283

[22] Filed: Jul. 28, 1983

[30] Foreign Application Priority Data

Sep. 29, 1982 [DE] Fed. Rep. of Germany ....... 3236073

[51] Int. Cl.[4] .............................................. H04N 3/14
[52] U.S. Cl. ................................................ 358/213
[58] Field of Search ................. 358/213, 44, 209, 212; 357/24 LR, 30; 250/578

[56] References Cited

U.S. PATENT DOCUMENTS

| | | | |
|---|---|---|---|
| 3,946,151 | 2/1976 | Kamiyama et al. | 358/213 |
| 4,360,833 | 11/1980 | Kinoshita et al. | 358/213 |
| 4,547,806 | 10/1985 | Herbst et al. | 358/213 |

OTHER PUBLICATIONS

"Solid-State Image Sensor Array RA 100×100", Reticon Preliminary Data Sheet, Sep. 28, 1978, six pages, three tables, 7 FIGS.

J. A. Hall, "Amplifier and Amplifier Noise Considerations", Solid State Imaging, NATO Advanced Study Institute Series E: Applied Sciences, No. 16, 1976, pp. 535–559.

M. H. White et al, "Characterization of Surface Channel CCD Arrays at Low Light Levels", Journal of Solid-State Circuits, vol. SC-9, No. 1, Feb. 1974, pp. 1–13.

Primary Examiner—Gene Z. Rubinson
Assistant Examiner—Stephen Brinich
Attorney, Agent, or Firm—Hill, Van Santen, Steadman & Simpson

[57] ABSTRACT

A two-dimensional semiconductor image sensor has row lines which are selectable over a vertical shift register for driving first selection transistors of the sensor elements. Column lines are connected to a read-out line by way of first switches which are sequentially driven by the outputs of a horizontal shift register. Blooming is reduced. This is achieved by providing second selection transistors for the sensor elements which are connected in series with the first selection transistors and which are sequentially driven by the outputs of the horizontal shift register, and is further achieved by further switches which connect the column lines to a reference potential and which are inversely selectable relative to the first switches.

9 Claims, 4 Drawing Figures

TWO-DIMENSIONAL SEMICONDUCTOR IMAGE SENSOR INCLUDING AN ARRANGEMENT FOR REDUCING BLOOMING

BACKGROUND OF THE INVENTION

1. Field of the Invention

The present invention relates to a two-dimensional semiconductor image sensor comprising sensor elements disposed on a doped semiconductor body in rows and columns, wherein row lines which are selectable over assigned parallel outputs of a vertical shift register serve for driving first selection transistors of the sensor elements over which exposure-dependent sensor signals formed in the sensor elements are transmitted to column lines and wherein the column lines are successively connected to a read-out line via switches which are driveable by parallel outputs of a horizontal shift register, the read-out line exhibiting an output for the sequential read-out of the sensor signals.

2. Description of the Prior Art

A semiconductor image sensor of the type set forth above is known from the data sheet "Reticon Solid-State Image Sensor Arrays" of the Reticon Corporation, Mountain View, Calif. USA.

Overexposure of the sensor elements represents a general problem given semiconductor image sensors. When, due to overexposure, more charge carriers are released in a sensor element than can be absorbed, the excess charge carriers flow off into adjacent image elements or onto the column lines. This spread of the charge carriers is referred to as "blooming".

SUMMARY OF THE INVENTION

The object of the present invention is to provide a semiconductor image sensor of the type generally set forth above having a space-saving arrangement for reducing blooming.

According to the invention, the above object is achieved by an image sensor of the type generally set forth above and which is characterized in that the parallel outputs of the horizontal shift register additionally serve for the column-wise drive of second selection transistors of the sensor elements; in that the second selection transistors are respectively disposed in series to the first selection transistors; in that the column lines are connected to a reference potential over further switches; and in that the switches driven by the parallel outputs of the horizontal shift register are further driveable inversely relative to the further switches.

The advantage which may be attained in practicing the present invention, is that the arrangement for reducing blooming has only a slight additional space requirement and operates very effectively. A reduction of blooming to, for example, approximately 1/500 can be achieved.

According to particular features of the invention, advantageous methods are disclosed for operating a semiconductor image sensor and an image sensor designed according to a particular feature of the invention has the additional advantage that it emits sensor signals which are substantially free of noise and interference voltages.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
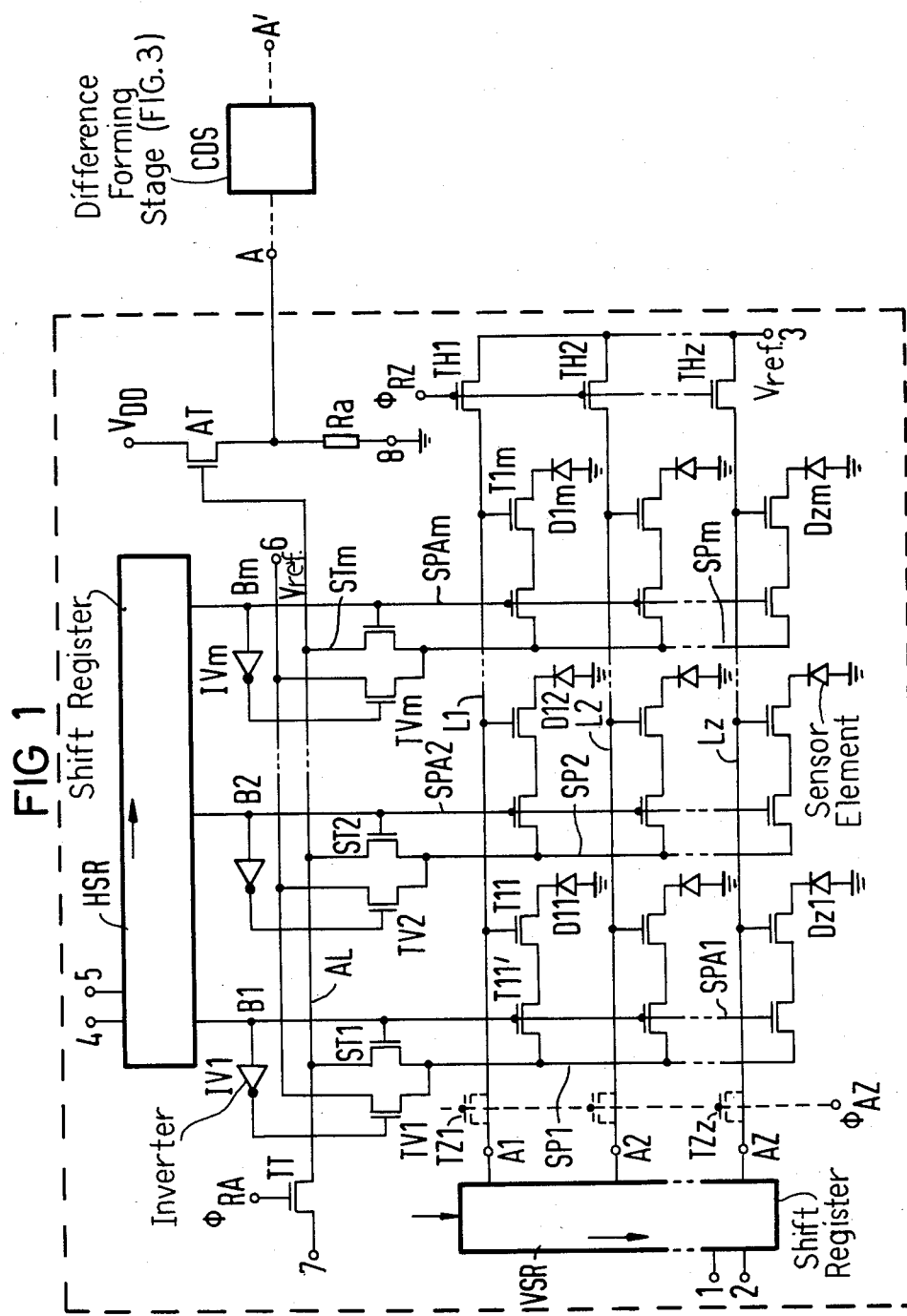
FIG. 1 is a schematic circuit diagram of the two-dimensional semiconductor image sensor constructed in accordance with the present invention.

A monolithically-integratable circuit having a two-dimensional semiconductor image sensor is illustrated in FIG. 1 as comprising photodiodes exhibiting sensor elements disposed in rows and columns. The photodiodes lying in the first row are Referenced D11–D1m. The respective switching paths of first selection transistors T11–T1m are provided in series therewith, their gates being connected to a common row line L1. The line L1 is connected to a parallel output A1 of a vertical shift register VSR which exhibits clock pulse inputs 1 and 2. The row lines L1–Lz are assigned in an analogous manner to the further rows of photodiodes and first selection transistors, the row lines being connected to parallel outputs A1–Az of the shift register VSR. Each of the row lines L1–Lz is connected by way of a switching transistor TH1–THz to a circuit terminal 3 which is connected to a reference potential. The gates of the transistors TH1–THz have a common terminal which is connected to receive a clock voltage $\phi_{RZ}$. The lower terminals of all photodiodes D11, etc, are respectively connected to the reference potential.

Respective second selection transistors are provided in series with the first selection transistors of the sensor element, whereby the exposure-dependent sensor signals formed in the sensor elements are transmitted to a so-called column line over the series connection of both selection transistors. In FIG. 1, for example, the sensor element D11 is connected by way of a first selection transistor T11 and a second selection transistor T11' to a column line SP1. Likewise, the remaining sensor elements of the first column up to and including the diode Dz1 are respectively connected to the column line SP1 over the series connections of two selection transistors. The column line SP1 is, in turn, connected by way of a column selection transistor ST1 to a read-out line AL which is connected to the gate of an output transistor AT. The gate of the column selector transistor ST1, together with the gates of the second selection transistors which are assigned to the same sensor elements D11–Dz1 of the first column, are connected by way of a column selection line SPA1 to the first parallel output B1 of a horizontal shift register HSR which is provided with clock pulse inputs 4 and 5.

In an analogous manner, a column line SP2 connected to the read-out line AL over a column selection transistor ST2 is assigned to the sensor elements of the second column, whereby the gate of the transistor ST2, together with the gates of the second selection transistors of the sensor elements of this column, is connected to the second parallel output B2 of the horizontal shift register HSR by way of a column selection line SPA2. Finally, the remaining columns of sensor elements, for example the elements D1m–Dzm, are connected to the read-out line AL by way of column lines, for example the lines SPm and the column selection transistors, for example STm, assigned thereto, whereby the appertaining second selection transistors and column selection transistors, for example STm, are respectively driven over assigned column selection lines, for example the column selection line SPAm, by a parallel output, for example the output Bm, of the horizontal shift register HSR. The column lines SP1–SPm are connected over switching segments of the transistors TV1–TVm to a circuit point 6 which lies at a reference potential $V_{ref}$. The gates of the transistors TV1–TVm are connected to the outputs of inverters IV1–IVm whose inputs are connected to the outputs B1–Bm of the horizontl shift register HSR. The read-out line AL is connected by way of the switching segment of a transistor TT to a circuit point 7 which preferably lies at the same reference potential as the circuit point 6. The gate of the transistor TT therefore lies at a terminal connected to receive a clock voltage $\phi_{RA}$.

With its drain terminal, the output transistor AT is connected to a supply voltage $V_{DD}$, whereas its source terminal is connected by way of a load element RA to a reference potential. The source terminal of the transistor AT which represents the output of the read-out line AL simultaneously forms the sensor output A.

The shift registers VSR and HSR are preferably constructed as two-phase, dynamic fed back shift registers. A logical "1" is transferred from stage-to-stage in the vertical shift register VSR as a function of two clock pulse voltages supplied by way of the inputs 1 and 2. The transfer direction is indicated by an arrow. One here proceeds from the assumption that a logical "1" is applied to the output A1 of the first stage of the shift register VSR at a specific time t1 (FIG. 2), whereby the voltage appearing at the output A1 is referenced $U_{A1}$. After the appearance of the next successive clock pulses at the inputs 1 and 2, the "1" shifted in the direction of the arrows such a degree that it is applied to the second parallel output A2 as a voltage $U_{A2}$. This forwarding of the "1" is continued until the output $A_z$ of the last stage is provided with a voltage. The next successive clock pulses at 1 and 2 then return the "1" to the output A1 of the first stage. The outputs of the respective stages not receiving the "1" lie at the potential "0".

The shift register HSR is operated in the same manner by way of the clock pulse voltages supplied to the inputs 5 and 6. A logic "1" is thereby shifted in the direction of the arrow in the clock rhythm of the clock pulse voltages, this leading to /voltages $U_{B1}$, $U_{B2}$, etc at the parallel outputs B1, B2, etc.

At the time t1, the row lines are reset from $\phi_{RZ}$ to the reference potential of the point 3 by way of the clock pulse 9. Due to the appearance of the voltage $U_{A1}$ at the time t2, the first row or sensor elements, i.e. D11–D1m, is selected for read-out in that their first selection transistors T11–T1m are turned on by way of the line L1. At the same time, the read-out line is reset to the reference potential of the point 7 by way of the clock pulse 10 of the voltage $\phi_{RA}$. At the time t3, a voltage $U_{B1}$ appears at the parallel output B1 of the horizontal shift register HSR; simultaneously therewith, the voltage $\overline{U_B}$ (FIG. 2) previously present at the output IV1 is disconnected. The column selection line SPA1 is selected by the pulse 11 of the value $U_{B1}$, whereby the transistor ST1 and the second selection transistor T11', etc., of the first column are turned on. However, only the sensor element D11 lying at the intersection of the selected lines L1 and SP1 is read. The exposure-sensitive sensor signal stored in the device D11 is thereby transferred over the elements T11, T11', SPA1, ST1, AL and AT to the output A. What is thereby significant is that this transmission occurs only during the appearance of the pulse 11 of the voltage $U_{B1}$, in contrast whereto the voltage $\overline{U_{B1}}$ switches the transistor TV1 on before and after the appearance of the voltage $U_{B1}$ so that the column line SP1 lies at the potential $B_{ref}$ by way of which potential excess charge carriers which extend from the sensor elements T11–Dz1 onto the line SP1 as a result of the described blooming are diverted over the transistor TV1. Moreover, the remaining column lines SP2–SPm are always connected over the transistors TV2–TVm to the reference potential $V_{ref}$ of the circuit point 6 in those respective time intervals in which they do not serve for the transmission of sensor signals from the columns of the sensor assigned thereto. Excess charge carriers appearing on these column lines are therefore likewise largely removed.

Figure 2:
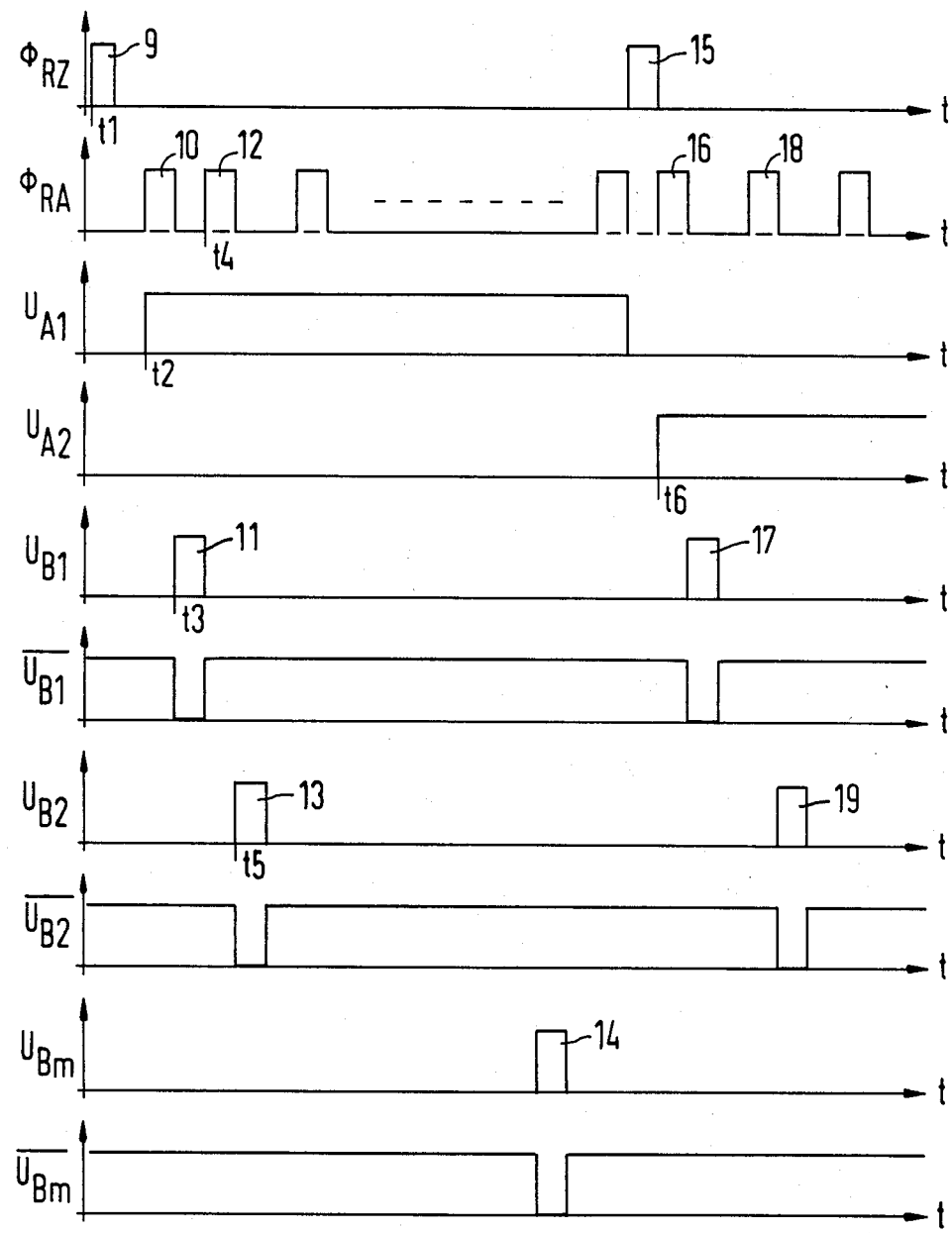
FIG. 2 is a plurality of voltage/time diagrams for explaining the operation of the apparatus illustrated in FIG. 1.

FIG. 2 illustrates that, after reading of the sensor signal from the element D11, i.e. at the time t4, the read-out line AL is reset over the transistor TT by way of the pulse 12 of the clock $\phi_{RA}$, whereupon the pulse 13 of a potential $U_{B2}$ at the time t5 selects the second column selection line SPA2 which effects a transmission of the sensor signal from the element D12 to the output A in a manner analogous to the reading operation already described above. Further reading events follow, whereby the pulse 14 of the voltage $U_{Bm}$ relates to the reading of the sensor signal from the element D1m. The voltage $U_{A1}$ is subsequently disconnected, whereupon a pulse 15 of the clock $\phi_{RZ}$ effects a resetting of the row lines L1–Lz. Subsequently thereto, a sequential read-out event for the sensor elements of the second sensor line begins after the appearance of the voltage $U_{A2}$ at the time t6, the reading being controlled by the pulses 16–19 in the same manner as set forth above with respect to the pulses 10–13. After reading of all sensor elements of the image sensor, further complete reading operations follow in periodic sequence.

Given the arrangement according to FIG. 1, the blooming is reduced to $$\frac{1/m}{1 - 1/m} = 1/m$$

where m denotes the plurality of sensor elements in a single row.

Figure 3:
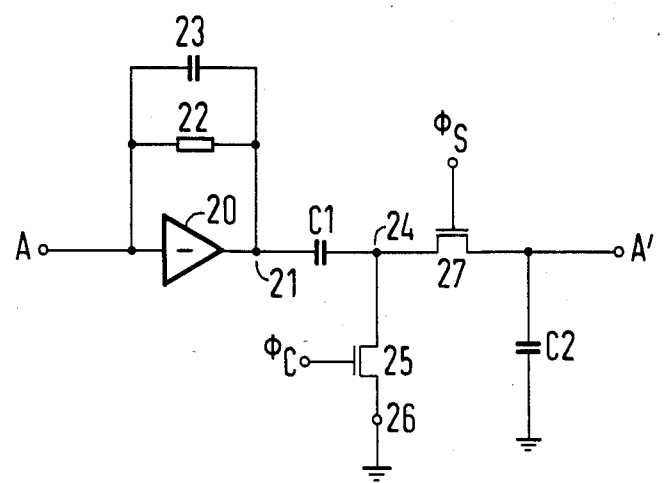
FIG. 3 is a basic circuit diagram of a difference forming stage disposed in series with the output of the read-out line.

FIG. 3 illustrates a circuit diagram of an advantageous embodiment of a difference-forming stage CDS which follows a sensor output A of FIG. 1 in accordance with a further feature of the invention. In this case, an output A' forms the actual sensor output. In addition, row selection transistors TZ1–TZz are connected between the row lines L1–Lz and the outputs A1–Az, the gates of such row selection transistors TZ1–TZz being connected to a clock pulse $\phi_{AZ}$ by way of a shared terminal.

The stage CDS according to FIG. 3 is constructed such that one proceeds from the input A to a preamplifier 20 whose output 21 is fed back to the input A by way of a parallel connection of a resistor 22 and a capacitor 23. Connected in series with the output 21 is a capacitor C1 having a terminal 24 opposite the amplifier output which is connected by way of a switching transistor 25 to a circuit point 26 which, in turn, is connected to a reference potential. The gate of the switching transistor 25 is connected to receive a clock voltage $\phi_C$. The terminal 24 is connected by way of the switching segment of a switching transistor 27 to the first terminal of the capacitor C2 whose second terminal is connected to the reference potential. The first terminal of the capacitor C2 forms the output A' of the stage CDS and, therefore, the output of the image sensor. The circuit elements 27 and C2 represent a sample and hold stage. The gate of the transistor 27 is thereby connected with a clock voltage $\phi_S$.

A difference forming stage of the type set forth above can be derived, for example, from the book by P. G. Jespers et al, entitled "Solid State Imaging" and from the series "NATO Advanced Study Institutes", Series E, No. 16, 1976, Verlag Noordhoff International Publishing, Leyden, pp. 535-559, particularly FIG. 9. A similarly-constructed stage is also disclosed in the IEEE Journal of Solid State Circuits, Vol. SC-9, No. 1, February 1974, pp. 1-13, cf. in particular, FIG. 5.

Figure 4:
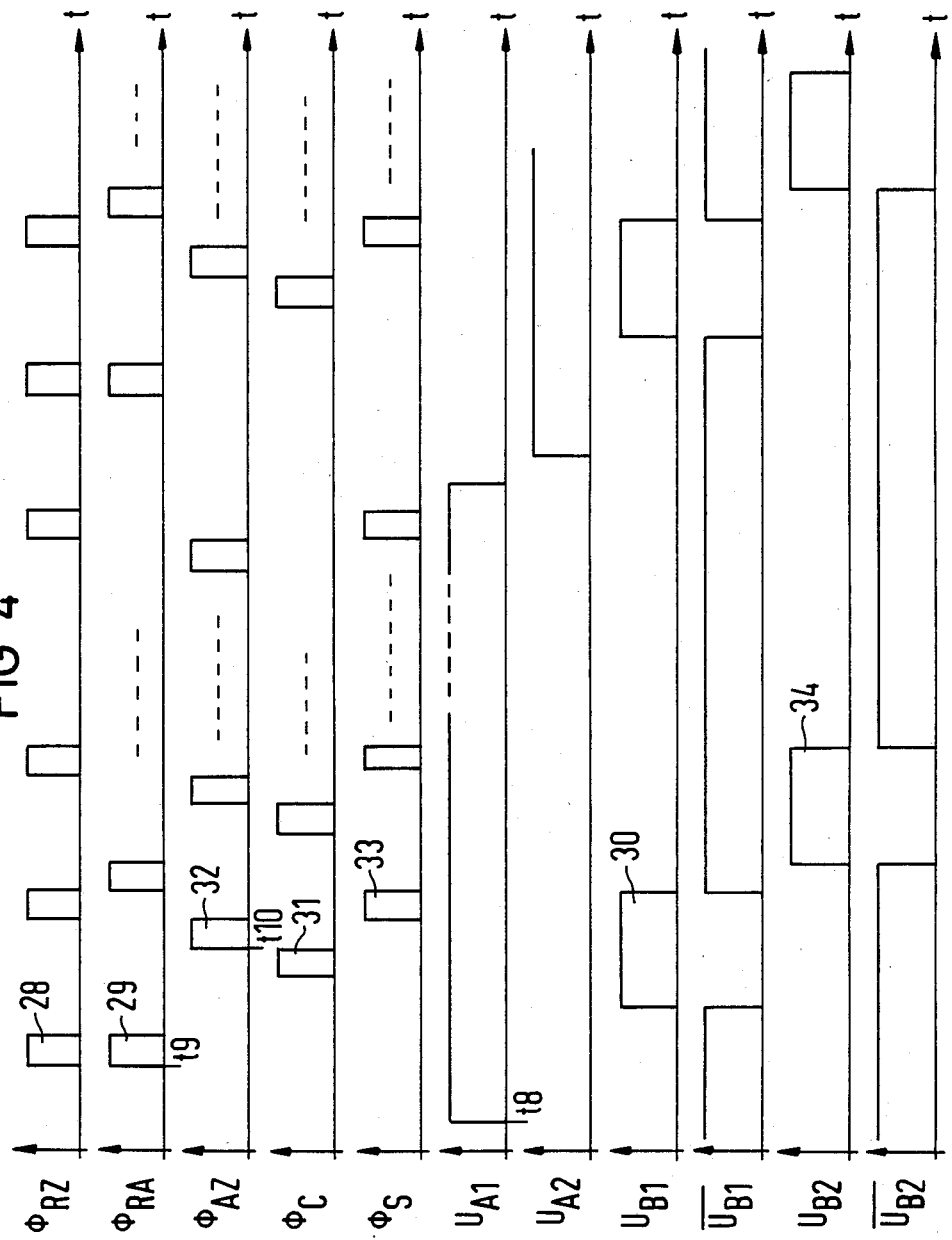
FIG. 4 is a plurality of voltage/time diagrams for explaining the operation of a semiconductor image sensor constructed in accordance with FIGS. 1 and 3.

The read-out operation given an image sensor augmented by the row selection transistors TZ1-TZz and by the stage CDS is explained below with reference to FIG. 4. At a time t8, a voltage $U_{A1}$ appears at the output A1 of the shift register VSR. As a result, the first of sensor elements, i.e. the elements D11-D1m is selected for reading. The row selection transistor TZ1, however, still remains blocked. At the time t9, the row lines L1-Lz are reset to the reference potential of the point 3 by the clock pulse 28 of the clock $\phi_{RZ}$, whereas the line AL is reset to the reference potential of the point 7 due to the pulse 29 of the clock $\phi_{RA}$. Upon appearance of a pulse 30 of a voltage $U_{B1}$, the line SPA1 is selected, whereby the transistor ST1 and the second selection transistors T11' etc of the first sensor column are switched on. The line SP1 is connected by way of the transistor ST1 to the line AL. The momentary value of the noise on the line SP1 and on the line AL, as well as the noise voltage input occurring due to the switching of the transistor T11', etc and the transistor ST1 are stored with a negative operational sign in the capacitor C1 due to a pulse 31 of the clock $\phi_C$ which turns on the switching transistor 25 (FIG. 3). At a time t10, all first selection transistors T11-T1m of the selected row are turned on by way of a pulse 32 of the clock $\phi_{AZ}$. Therefore, the sensor element lying at the intersection of the selected lines L1 and SPA1 is read. The read-out sensor signal which is likewise affected with the momentary value of the noise on the line SP1 and the line AL, as well as with the noise voltage inputs has the signal with a positive operational sign previously stored in the capacitor C1 superimposed thereon after inhibit of the switching transistor 25 (FIG. 3), so that the sensor signal, rid at the circuit point 24 of such noise voltages and interfering voltage inputs, occurs as the difference of the two successively-read signals. As a result of a pulse 33 of a clock $\phi_S$, the signal value obtained in such a manner is transmitted over the transistor 27 to the capacitor C2 and is stored thereat so that it can be tapped at the output A'

After the appearance of a pulse 34 of a value $U_{B2}$, an equivalent reading operation follows for the sensor element D12 and analogous thereto, further reading operations occur for the remaining sensor elements of the first row and of further rows. The complete reading operation of the overall image sensor periodically repeats. The voltages $\overline{U_{B1}}$, $\overline{U_{B2}}$, etc guarantee a considerable reduction of blooming in the manner already described above.

The first and second selection transistors, for example the transistors T11 and T11', of a sensor element, for example a sensor element D11, can be combined in a space-saving manner to form a dual gate transistor. The gate of the transistor T11' can thereby be formed of a first layer of polycrystalline silicon and the gate of the transistor T11 can be formed of a second such layer.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a two-dimensional image sensor of the type wherein a plurality of sensor elements are carried in columns and rows by a doped semiconductor body, wherein row lines are selected by way of assigned parallel outputs of a row shift register to selectively drive first selection transistors respectively connected to the sensor elements for transmitting exposure-dependent sensor signals, formed in the sensor elements, over the first selection transistors to respective column lines, wherein the column lines are successively connected to a read-out line connected to a read output for reading the sensor signals via respective column selection transistors each serially connected to a respective first selection transistor and driven by parallel outputs of a column shift register, the improvement therein comprising:
    second selection transistors each serially connected between a respective first selection transistor and a respective column line and connected to and driven by the outputs of the column shift register;
    a plurality of switching transistors each serially connected between a respective column line and a reference potential; and
    inverter means connecting the respective outputs of the column shift register to said switching transistors so that said column selection transistors and said switching transistors are inversely driven relative to one another.

2. The improved two-dimensional image sensor of claim 1, wherein said switching transistors constitute first switching transistors, and further comprising:
    a plurality of clock-driven second switching transistors each connected between a respective row line and the reference potential; and
    a clock-driven third switching transistor connected between the read-out line and the reference potential.

3. The improved two-dimensional image sensor of claim 2, and further comprising:
    a plurality of clock-driven fourth switching transistors each connected between a respective row line and a respective output of the row shift register.

4. The improved two-dimensional image sensor of claim 3, and further comprising:
    a difference-forming stage connected to the read output and operable to provide a difference signal of two successively-read sensor signals.

5. The improved two-dimensional image sensor of claim 4, wherein said difference-forming stage comprises:
- a preamplifier including an input connected to the read output, and an output;
- a capacitor including a first terminal connected to said output of said preamplifier, and a second terminal;
- a clock-driven switch connected between said second terminal and a reference potential; and
- a sample and hold circuit connected to said second terminal of said capacitor for sampling and intermediately storing signals received via said preamplifier and said capacitor.

6. The improved two-dimensional image sensor of claim 5, wherein said sample and hold circuit comprises:
- an output;
- a further capacitor including a first terminal connected to said output, and a second terminal connected to the reference potential; and
- a clock-driven switch connected between said second terminal of the first-mentioned capacitor and said first terminal of said second capacitor.

7. A method of operating a two-dimensional image sensor which comprises columns and rows of sensor elements which produce exposure-dependent sensor signals, comprising the steps of:
- activating a row of first selection transistors to prepare a transmission of the sensor signals of the selected row to respective column lines;
- sequentially turning on column selection transistors and respective second row selection transistors to sequentially transmit the sensor signals to a read-out line while simultaneously sequentially opening respective further normally-conductive transistors which normally connect the column lines to a reference potential to remove such reference potential; and
- sequentially repeating the above steps for each row.

8. The method of claim 7, wherein each of the sensor elements is connected to the respective column line by its first selection transistor and a second selection transistor in series therewith, and each row line is connected in series with a respective row selection transistor, and wherein the step of activating a row of first selection transistors is further defined as:
- selecting, and maintaining blocked for a predetermined interval, a row selection transistor; and
- during the predetermined interval, activating a column selection and second selection transistor to connect to the read-out line noise and interference voltages due to transistor actuation;
- during the predetermined interval, storing the noise and interference voltages with a first operational sign;
- at the end of the predetermined interval, switching the selected row transistor conductive to transmit the respective sensor signal, including noise and interference voltages, to the read-out line; and
- superimposing, with a second, opposite operational sign, the read sensor signal and the stored noise and interference voltage to form a difference signal.

9. The method of claim 8, and comprising the further step of:
- prior to activating a column selection transistor, resetting the row and read-out lines to a reference potential.

* * * * *